(12) United States Patent
Koren et al.

(10) Patent No.: US 10,985,118 B2
(45) Date of Patent: Apr. 20, 2021

(54) HIGH-FREQUENCY MODULE

(71) Applicants: Guy Koren, Reshon Lezion (IL); Ben Rubovitch, Modiin (IL)

(72) Inventors: Guy Koren, Reshon Lezion (IL); Ben Rubovitch, Modiin (IL)

(73) Assignees: XSIGHT LABS LTD., Kiryat Gat (IL); DustPhotonics, Modiin (IL)

( * ) Notice: Subject to any disclaimer, the term of this patent is extended or adjusted under 35 U.S.C. 154(b) by 0 days.

(21) Appl. No.: 16/282,306

(22) Filed: Feb. 22, 2019

(65) Prior Publication Data

US 2020/0273822 A1 Aug. 27, 2020

(51) Int. Cl.
*H01L 23/66* (2006.01)
*H01L 23/498* (2006.01)
*H01L 23/367* (2006.01)
*H01L 23/00* (2006.01)

(52) U.S. Cl.
CPC .......... *H01L 23/66* (2013.01); *H01L 23/3672* (2013.01); *H01L 23/49822* (2013.01); *H01L 23/49827* (2013.01); *H01L 24/16* (2013.01); *H01L 2223/6611* (2013.01); *H01L 2224/16227* (2013.01)

(58) Field of Classification Search
CPC ................. H01L 23/66; H01L 23/3672; H01L 23/49822; H01L 23/49827; H01L 2223/6611; H01L 24/16
See application file for complete search history.

(56) References Cited

U.S. PATENT DOCUMENTS

| 8,275,001 | B1 | 9/2012 | Ferguson | |
|---|---|---|---|---|
| 2011/0155433 | A1* | 6/2011 | Funaya | H05K 1/115 174/258 |
| 2012/0124257 | A1 | 5/2012 | Wu | |
| 2013/0279139 | A1 | 10/2013 | Deng | |
| 2014/0029639 | A1* | 1/2014 | Zarbock | G02B 6/4274 372/50.1 |
| 2018/0012881 | A1* | 1/2018 | Scanlan | H01L 21/4853 |
| 2019/0057924 | A1 | 2/2019 | Samsung | |
| 2019/0334220 | A1 | 10/2019 | Ali et al. | |

\* cited by examiner

*Primary Examiner* — Timor Karimy
(74) *Attorney, Agent, or Firm* — Reches Patent

(57) ABSTRACT

A method and a high-frequency module that includes (a) a high frequency die that includes multiple die pads, (b) a substrate that comprises a first buildup layer, a second buildup layer and a core that is positioned between the first buildup layer and a second buildup layer, (c) a heat sink and coupling module that comprises a heat sink and multiple first conductors that pass through the heat sink and extend outside the heat sink; (d) a line card that comprises multiple line card pads that are coupled to external ends of the multiple first conductors; (e) coupling elements that are coupled to internal end of the multiple first conductors; and (f) multiple second conductors that pass through the substrate without reaching a majority of a depth of the core, and couple the multiple die pads to the coupling elements. The high frequency it not lower than fifty gigabits per second.

12 Claims, 7 Drawing Sheets

| 210 | 220 | 230 |

HIGH-FREQUENCY MODULE

BACKGROUND

In high throughput optoelectronic circuits one or more dies are mounted on a substrate (also known as a carrier) that in turn is mounted on a ball grid array that in turn is supported by a line card.

FIG. 1 illustrates a prior art module 110 that includes die 130, having die pads such as first die pad 131 and second die pad 132. The die pads are connected to bumps such as first bump 111 and second bump 112.

The bumps are positioned above substrate 150. Substrate 150 includes a first buildup layer 151, a second buildup layer 153 and a core 152 that is positioned between the first buildup layer and a second buildup layer.

A ball grid array is positioned between the substrate 150 and the card line. Ball shaped conductors of the ball grid array are electrically coupled to through vias that pass through the entire substrate 150.

A first conductive path includes a sequence of connected elements that include (from top to bottom) first die pad 131, first pad 111, first through via 113, ball shaped conductor 115, and first line card pad 117 of line card 120.

A second conductive path includes a sequence of connected elements that include (from top to bottom) second die pad 132, second pad 112, second through via 114, ball shaped conductor 116, and second line card pad 118 of line card 120.

When the core is thick—for example reaches a thickness of one millimeter—the conductive paths between die 130 and the line card become long and distort high frequency signals that pass through them. Furthermore—these conductive paths have a relatively high capacitance that may limit the maximal frequency of signals that are supported by the conductive paths. For example—when the core thickness is about one millimeter the conductive paths can not support high frequency signals of one hundred Gigabyte per second.

There is a growing need to electrically couple the line card to the integrated circuits in a more efficient manner.

SUMMARY OF THE INVENTION

According to an aspect of the presently disclosed subject matter there is provided a high-frequency module that may include a high frequency die that may include multiple die pads; a substrate that may include a first buildup layer, a second buildup layer and a core that may be positioned between the first buildup layer and a second buildup layer; a heat sink and coupling module that may include a heat sink and multiple first conductors that pass through the heat sink and extend outside the heat sink; a line card that may include multiple line card pads that may be coupled to external ends of the multiple first conductors; coupling elements that may be coupled to internal end of the multiple first conductors; multiple second conductors that pass through the substrate without reaching a majority of a depth of the core, and couple the multiple die pads to the coupling elements; and wherein the high frequency it not lower than fifty gigabits per second.

The multiple second conductors may not pass through the core.

The coupling elements may be high frequency contacts that may be positioned between the substrate and bottom of the heat sink and coupling module.

The high frequency module wherein the high frequency die may be positioned between the substrate and the heat sink and coupling module.

The high frequency module wherein a top of the high frequency die may be positioned within a recess formed within the heat sink and coupling module.

The heat sink and coupling module may be thermally coupled to the high frequency die.

The high-frequency module may include a bumps that may be positioned between the multiple die pads and the multiple second conductors.

The high frequency die may be a high frequency optoelectronic die.

The high frequency it not lower than one hundred gigabits per second.

The depth of the core may be not lower than a millimeter.

The heat sink and coupling module may include multiple heat sink fins that may be spaced apart from each other; wherein the first conductors extend through gaps between the multiple fins.

The first conductors may be arranged in a grid of columns and rows, wherein each row may be positioned in a single gap.

There may be provided a method for conveying high-frequency signals between a line card and a high frequency die of a high frequency module, the method may include: outputting a first high frequency signal from a first die pad of the high frequency die; and conveying the first high frequency signal through a first conductive path to a first line card pad of the line card; wherein the first conductive path passes through a substrate without reaching a majority of a depth of a core of the substrate; and wherein the high frequency it not lower than fifty gigabits per second.

The method may include outputting a second high frequency signal from a second line card pad of the line card; and conveying the second high frequency signal through a second conductive path to a second die pad of the high frequency die; wherein the second conductive path passes through the substrate without reaching the majority of the depth of the core of the substrate.

The high frequency die may include multiple die pads; the line card may include multiple line card pads; the high frequency module may include first conductors that pass through a heat sink of the high frequency module, extend outside the heat sink and couple the multiple line card pads to coupling elements; the coupling elements couple the first conductors to multiple second conductors that couple the multiple coupling elements to the multiple die pads; wherein the multiple second conductors pass through the substrate without reaching the majority of the depth of the core; wherein the multiple line card pads may include the first line card pad; wherein the multiple die pads may include the first die pad; and wherein the first conductive path may include a first conductor that belongs to the multiple conductors.

The method may include dissipating heat generated by the high frequency die by the heat sink, wherein the heat sink may be connected to a top surface of the high frequency die and extends outside the aperture.

The method may include dissipating heat generated by the high frequency die by the heat sink, wherein the heat sink may be thermally coupled to the high frequency die.

The first conductive path may include a first bump of bumps that may be positioned between the multiple die pads and the multiple conductors.

The high frequency die may be a high frequency optoelectronic die.

The high frequency it not lower than one hundred gigabits per second.

The depth of the core may be not lower than a millimeter.

The heat sink and coupling module may include multiple heat sink fins that may be spaced apart from each other; wherein the first conductors extend through gaps between the multiple fins.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 6 illustrates an example of a method.

DETAILED DESCRIPTION OF THE DRAWINGS

Figure 1:
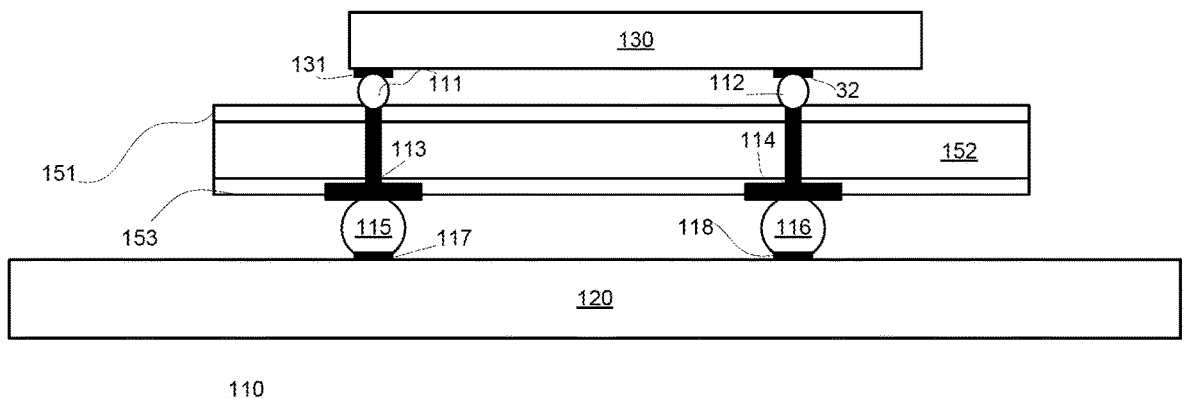
FIG. 1 illustrates a prior art module.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a module capable of executing the method.

Any reference in the specification to a module should be applied mutatis mutandis to a method that may be executed by the module.

The term "substantially"—unless stated otherwise may refer to a deviation of few percent (for example—deviation of less than ten percent or less than 20 percent).

Any combination of any module, die, circuit, or component listed in any of the figures, any part of the specification and/or any claims may be provided. Especially any combination of any claimed feature may be provided.

The term "high frequency" means at least fifty gigabytes per second. For example—one gigabytes per second.

Figure 2:
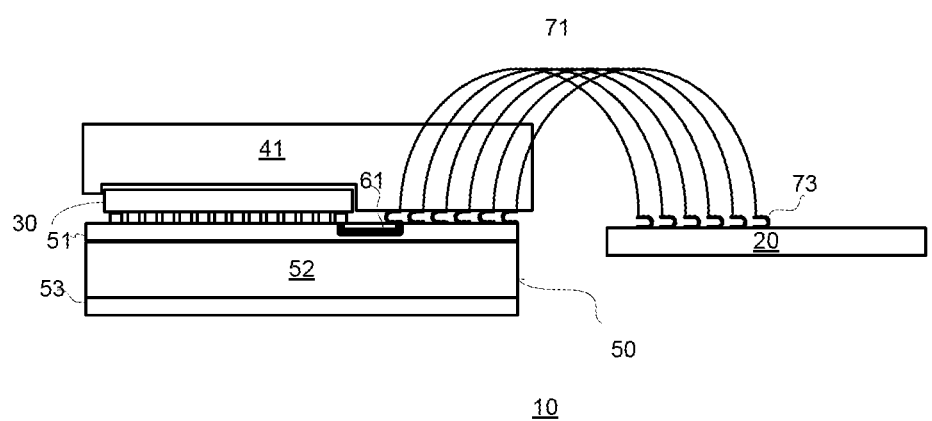
FIG. 2 illustrates an example of a high frequency module.
Figure 3:
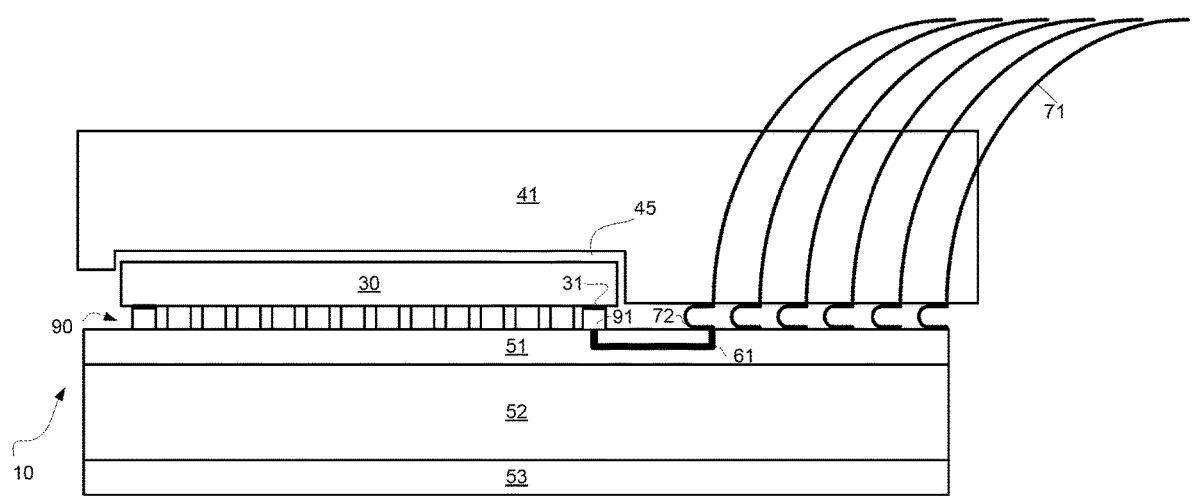
FIG. 3 illustrates an example of a high frequency module.
Figure 4:
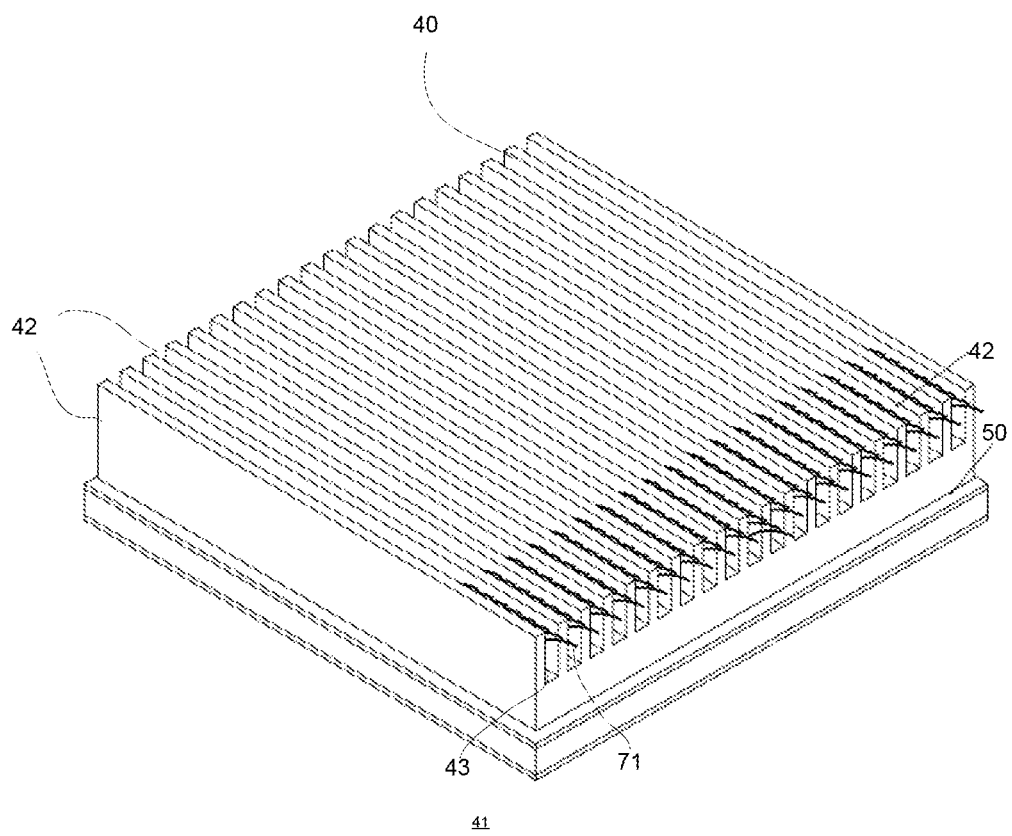
FIG. 4 illustrates an example of a high frequency module.
Figure 5:
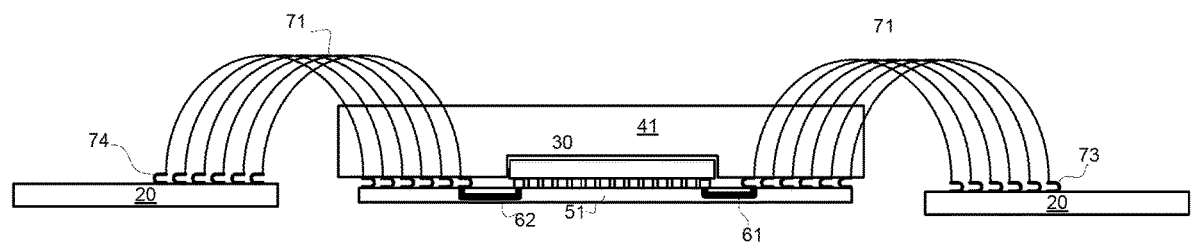
FIGS. 5 and 7 illustrate examples of high frequency modules.

FIG. 2 is an example of a cross sectional view of a high frequency module 10. FIG. 3 is an example of a cross sectional view of a part of the high frequency module of FIG. 2, whereas for simplicity of explanation the heat sink of the high frequency module was omitted. FIG. 4 is an example of an isometric view of a part of the high frequency module of FIG. 2. FIG. 5 is an example of a cross sectional view of a part of the high frequency module of FIG. 2.

FIG. 2 illustrates a single line card 20 that is coupled to first conductors 71. FIGS. 3 and 4 do not illustrate any line card, for simplicity of explanation. FIG. 5 illustrates two different line cards or two parts of a single line card that are coupled to the first conductors 71.

Figure 7:
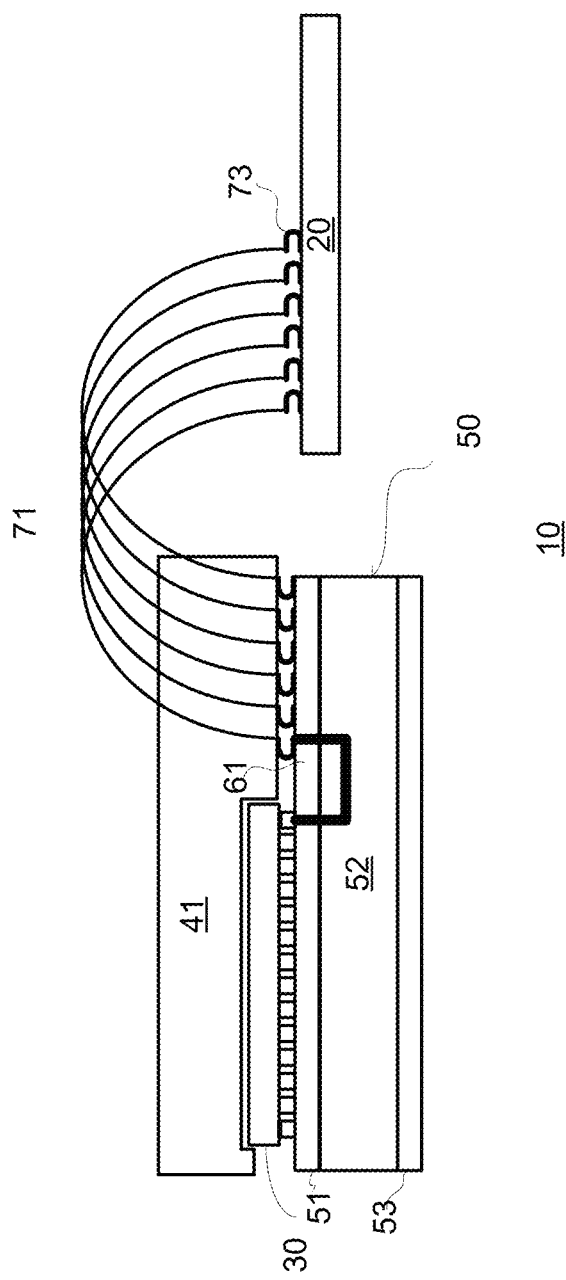

FIG. 2-5 illustrates a high-frequency module 10 that may include:
  a. A high frequency die 30 that may include multiple die pads such as first die pad (denoted 31 in FIG. 3).
  b. Substrate 50 that may include first buildup layer 51, second buildup layer 53 and core 52 that is positioned between the first buildup layer 51 and a second buildup layer 53. The substrate 50 of FIGS. 2-5 and the core 52 of FIGS. 2-5 may be much thicker then substrate 150 and core 152 of FIG. 1—while supporting high frequency signals that may exceed one hundred gigabytes per second. For example—the depth of the core may exceed one millimeter.
  c. Heat sink and coupling module 41 that includes heat sink 40 and multiple first conductors 71 that pass through the heat sink 40 and extend outside the heat sink.
  d. One or more line cards 20 that include multiple line card pads that are coupled (directly or through additional coupling elements 73 of FIGS. 2 and 5 and additional coupling elements 74 of FIG. 5) to external ends of the multiple first conductors.
  e. Coupling elements 72 that are coupled to internal end of the multiple first conductors.
  f. Multiple second conductors that pass through the substrate without reaching a majority of a depth of the core, and couple the multiple die pads to the coupling elements 72. In FIGS. 2-5 the conductors do not pass through core 52—but this is not necessarily so. In FIG. 7 the conductors pass through the substrate and even through the core 52 without reaching a majority of a depth of the core.

FIGS. 2-5 illustrate a single second conductor 61. Referring to FIG. 3—second conductor 61 is formed in the first build up layer 51 (does not pass through core 52)—and is electrically coupled between (a) first die pad 31 and first bump 91, and (b) a coupling element 72 such as a high frequency contact—especially a high frequency contact that has a U-shaped cross section, and first line card pad 22. The coupling element is also electrically coupled to first conductor 71 that may be coupled via an additional coupling element 72 to a line card pad.

The heat sink 40 may contact the top surface 35 or otherwise be thermally coupled to the high frequency die 30. For example—the heat sink 40 may be thermally coupled to the high frequency die via a conductive paste or intermediate material positioned between the heat sink the the high frequency die 30.

The high frequency die 30 is positioned between the substrate 50 and the heat sink and coupling module 41.

A top of the high frequency die is positioned within a recess 45 formed within the heat sink and coupling module 41.

The high frequency die 30 may receive and/or transmit signals having a high frequency—for example of a rate that exceed fifty gigabytes per second.

FIG. 4 illustrates that the heat sink 40 includes heat sink fins 42 that are spaced apart from each other. The first conductors 71 extend through gaps 43 between the multiple heat sink fins 42. The first conductors 71 may be arranged in a grid of columns and rows, wherein each row is positioned in a single gap 43.

The first die may be a CMOS die or may be fabricated by other manufacturing processes. The first die may be switch, any communication die, a processor, an optoelectronic die, and the like. For example—it is assumed that the first die is a high bandwidth ASIC such as a switch, specifically an Ethernet switch. It is noted that the first die may differ from an ASIC. It may, for example, be a field programmable gate array (FPGA).

Figure 6:
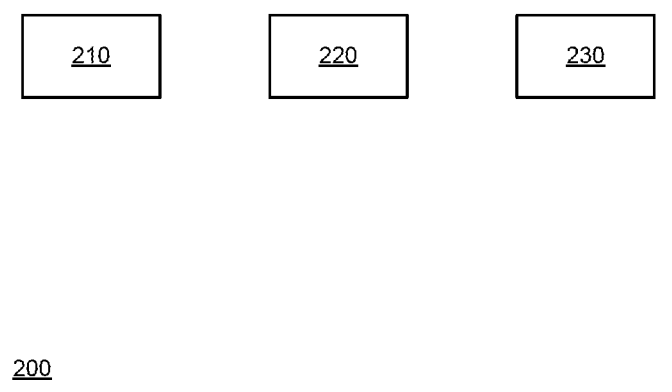

FIG. 6 illustrates method 200 for conveying high-frequency signals between a line card and a high frequency die of a high frequency module. The high frequency module may be any of the high frequency modules mentioned above.

Method 200 may start by at least one step out of steps 210 and 220.

Step 210 may include (a) outputting a first high frequency signal from a first die pad of the high frequency die; and (b) conveying the first high frequency signal through a first conductive path to a first line card pad of the line card. The first conductive path passes through a substrate without reaching a majority of a depth of a core of the substrate. The high frequency it not lower than fifty gigabits per second.

Step 220 may include (a) outputting a second high frequency signal from a second line card pad of the line card; and (b) conveying the second high frequency signal through a second conductive path to a second die pad of the high frequency die; wherein the second conductive path passes through the substrate without reaching the majority of the depth of the core of the substrate.

The high frequency die executing method 200 may include multiple die pads; the line card may include multiple line card pads; the high frequency module may include first conductors that pass through a heat sink of the high frequency module, extend outside the heat sink and couple the multiple line card pads to coupling elements; the coupling elements couple the first conductors to multiple second conductors that couple the multiple coupling elements to the multiple die pads; wherein the multiple second conductors pass through the substrate without reaching the majority of the depth of the core; wherein the multiple line card pads may include the first line card pad; wherein the multiple die pads may include the first die pad; and wherein the first conductive path may include a first conductor that belongs to the multiple conductors.

Method 200 may also include step 230 of dissipating heat generated by the high frequency die by a heat sink that is thermally coupled to the high frequency die—for example may be connected to a top surface of the high frequency die and extends outside the aperture.

Step 230 may be executed in parallel to step 210 and/or in parallel to step 220.

The terms "including", "comprising", "having", "consisting" and "consisting essentially of" are used in an replaceable but distinguishable manner. For example—any module or die may include at least the components included in the figures and/or in the specification, only the components included in the figures and/or the specification.

Any reference to the phrases "may" or "may be" should be applied to the phrases "may not" or "may not be".

The phrase "and/or" means additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between blocks are merely illustrative and that alternative embodiments may merge blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A high-frequency module, comprising:
   a high frequency die that comprises multiple die pads;
   a substrate that comprises a first buildup layer, a second buildup layer and a core that is positioned between the first buildup layer and a second buildup layer;
   a heat sink and coupling module, the heat sink and coupling module comprises the heat sink and multiple first conductors that pass through the heat sink and extend outside the heat sink;
   a line card that comprises multiple line card pads that are coupled to external ends of the multiple first conductors;
   coupling elements that are coupled to internal end of the multiple first conductors;
   multiple second conductors that pass through the substrate without reaching a majority of a depth of the core, and couple the multiple die pads to the coupling elements;
   wherein the high frequency it not lower than 50 gigabits per second.

2. The high-frequency module according to claim 1 wherein the multiple second conductors do not pass through the core.

3. The high-frequency module according to claim 1 wherein the coupling elements are high frequency contacts that are positioned between the substrate and bottom of the heat sink and coupling module.

4. The high frequency module according to claim 1 wherein the high frequency die is positioned between the substrate and the heat sink and coupling module.

5. The high frequency module according to claim 1 wherein a top of the high frequency die is positioned within a recess formed within the heat sink and coupling module.

6. The high-frequency module according to claim 1 wherein the heat sink and coupling module is thermally coupled to the high frequency die.

7. The high-frequency module according to claim 1 comprising bumps that are positioned between the multiple die pads and the multiple second conductors.

8. The high-frequency module according to claim 1 wherein the high frequency die is a high frequency optoelectronic die.

9. The high-frequency module according to claim 1 wherein the high frequency it not lower than 100 gigabits per second.

10. The high-frequency module according to claim 1 wherein the depth of the core is not lower than a millimeter.

11. The high-frequency module according to claim 1 wherein the heat sink and coupling module comprises multiple heat sink fins that are spaced apart from each other; wherein the first conductors extend through gaps between the multiple heat sink fins.

12. The high-frequency module according to claim 11 wherein the first conductors are arranged in a grid of columns and rows, wherein each row is positioned in a single gap.

* * * * *